United States Patent [19]

Seki et al.

[11] Patent Number: 5,604,761
[45] Date of Patent: Feb. 18, 1997

[54] LAYERED SEMICONDUCTOR LASER HAVING SOLDER LAMINATIONS AND METHOD OF MAKING SAME

[75] Inventors: Akinori Seki; Toyokazu Ohnishi, both of Toyota; Jiro Nakano, Okazaki; Takahide Sugiyama, Aichi-ken; Kazuyoshi Tomita, Nagoya; Hiroyuki Kano, Aichi-ken, all of Japan

[73] Assignee: Toyota Jidosha Kabushiki Kaisha, Toyota, Japan

[21] Appl. No.: 323,431

[22] Filed: Oct. 14, 1994

[30] Foreign Application Priority Data

Oct. 15, 1993 [JP] Japan .................................... 5-258510

[51] Int. Cl.⁶ ............................................. H01S 3/18
[52] U.S. Cl. ................................. 372/43; 372/44; 257/88
[58] Field of Search .............................. 372/43, 44, 50; 257/88; 437/208, 915

[56] References Cited

U.S. PATENT DOCUMENTS

| 4,306,278 | 12/1981 | Fulton et al. . | |
|---|---|---|---|
| 4,791,634 | 12/1988 | Miyake . | |
| 4,883,771 | 11/1989 | Kumabe et al. | 372/50 |
| 5,001,719 | 3/1991 | Trussell | 372/43 |

FOREIGN PATENT DOCUMENTS

| 57-56984 | 4/1982 | Japan . | |
|---|---|---|---|
| 58-142588 | 8/1983 | Japan | 372/43 |
| 60-196992 | 10/1985 | Japan . | |
| 4-48664 | 2/1992 | Japan . | |
| 4-78179 | 3/1992 | Japan . | |

OTHER PUBLICATIONS

Koszi, et al: "A Dual–Wavelength InP Channeled–Substrate Buried–Heterostructure Lase Light–Source", Solid State Electronics, vol. 30, No. 1, pp. 39–42, 1987. (January).
Patent Abstracts of Japan, vol. 13, No. 195 (E–754) May 10, 1989, & JP–A–01 014 985.
Patent Abstract of Japan, vol. 16 No. 486 (E–1276) Oct. 8, 1992 & JP–A–04 177 887.
Patent Abstracts of Japan, vol. 8 No. 66 (E–234) Mar. 28, 1984 & JP–A–58 216 485.

*Primary Examiner*—Rodney B. Bovernick
*Assistant Examiner*—Yisun Sang
*Attorney, Agent, or Firm*—Cushman, Darby & Cushman IP Group of Pillsbury Madison & Sutro LLP

[57] ABSTRACT

A semiconductor laser having a plurality of semiconductor laser chips laminated by solder layers which cause no interference with laser beams is provided. To this end, each of the semiconductor laser chips has a solder sump recess formed in the surface to be soldered at an end adjacent to a laser beam radiating surface and extending through portions of the chip except an active layer. This semiconductor laser is manufactured by a method comprising the steps of forming grooves in a surface of an epitaxial substrate along boundaries of semiconductor laser chip areas for defining laser beam radiating surfaces, each of the grooves extending through portions constituting the substrate except an active layer and having a bottom substantially parallel to the epitaxial substrate surface; cleaving the epitaxial substrate along the grooves to provide the semiconductor laser chips with laser beam radiating surfaces defined by the cleaved surfaces; and laminating the plurality of semiconductor laser chips one above another by soldering.

2 Claims, 5 Drawing Sheets

5,604,761

LAYERED SEMICONDUCTOR LASER HAVING SOLDER LAMINATIONS AND METHOD OF MAKING SAME

BACKGROUND OF THE INVENTION

1. Field of the Invention

The present invention relates to a semiconductor laser and a method of manufacturing the same, and more particularly to a semiconductor laser and a method of manufacturing the same wherein solder layers used for stacking a plurality of semiconductor laser chips cause no interference with laser beam radiation.

2. Description of the Prior Art

Conventionally, a semiconductor laser has been composed of a semiconductor laser chip stack having semiconductor laser chips laminated one above another by soldering. Such a prior art semiconductor laser is disclosed, for example, in Japanese Laid-Open Patent Publication Nos. 4-48664 and 478179. Such a semiconductor laser chip stack is suitable for providing high output.

FIG. 7 shows a sectional structure of such a prior art semiconductor laser. In FIG. 7, a semiconductor laser chip stack 70 is composed of semiconductor laser chips 71, 72 and 73 laminated one above another and joined to one another by respective solder layers 74 and 75.

The semiconductor laser chip 71 includes an active layer 71a which is formed at an end thereof with a laser beam radiating surface 71b. Similarly, the semiconductor laser chip 72 includes an active layer 72a which is formed at an end thereof with a laser beam radiating surface 72b, and the semiconductor laser chip 73 includes an active layer 73a which is formed at an end thereof with a laser beam radiating surface 73b.

The laser beam radiating surfaces 71b, 72b and 73b are arranged in a common plane. A laser beam 71c is emitted from the laser beam radiating surface 71b, a laser beam 72c from the laser beam radiating surface 72b, and a laser beam 73c from the laser beam radiating surface 73b.

In the above prior art, however, due to load applied when the semiconductor laser chip stack 70 is formed in layers, a solder flash 74a is formed at the end of the solder layer 74 and a solder flash 75a at the end of the solder layer 75. If formation of such flashes is to be avoided, the connecting strength will become disadvantageously insufficient, resulting in separation of chips and increase of connecting resistance.

Thus, the solder flash 74a interferes with the laser beam 71c, and the solder flash 75a interferes with the laser beam 72c, so that the laser beams 71c and 72c are restricted as shown in FIG. 7. Consequently, the prior art involves a defect that luminous efficiency of radiation of the semiconductor laser chip stack 70 is substantially reduced.

SUMMARY OF THE INVENTION

It is an object of the present invention to provide a semiconductor laser which has a sufficient connecting strength and a relatively small connecting resistance and which is effective to prevent substantial reduction of luminous efficiency of radiation caused by solder layers used for stacking semiconductor laser chips, and also to provide a method of manufacturing the same.

A first aspect of the present invention relates to a semiconductor laser having a plurality of semiconductor laser chips laminated one above another by soldering, each of the semiconductor laser chips having a solder sump recess formed in the surface to be soldered at an end adjacent to a laser beam radiating surface and extending through portions constituting the chip except an active layer.

In this semiconductor laser, any solder flashes generated in soldering of the semiconductor laser chips are substantially accommodated in corresponding solder sump recesses formed in respective surfaces of the chips to be soldered at the ends adjacent to the laser beam radiating surfaces and extending through portions of the chips except the active layers. Thus, the solder flashes will cause no interference with laser beams emitted from the laser beam radiating surfaces.

A second aspect of the present invention relates to a method of manufacturing a semiconductor laser having a plurality of semiconductor laser chips laminated one above another by soldering. The method comprises the steps of providing an epitaxial substrate having a plurality of semiconductor laser chip areas, forming grooves in the epitaxial substrate surface along boundaries of the semiconductor laser chip areas for defining laser beam radiating surfaces, each of the grooves extending through portions constituting the substrate except an active layer and having a bottom substantially parallel to the epitaxial substrate surface, cleaving the epitaxial substrate along the grooves to provide semiconductor laser chips with the cleaved surfaces defining respective laser beam radiating surfaces, and laminating a plurality of such semiconductor laser chips one above another by soldering.

According to this method, the semiconductor laser chips are formed by cleaving the epitaxial substrate along the grooves formed along the boundaries of the semiconductor laser chip areas for defining the laser beam radiating surfaces and extending through the portions constituting the epitaxial substrate except the active layer. Thus, portions of the active layer which are included in the cleaved surfaces provide laser beam radiating surfaces and totally reflecting surfaces, and each of the grooves is divided by the cleavage into two groove halves forming respective solder sump recesses. Thus, the semiconductor laser of the first aspect is manufactured.

The present invention will be more fully understood from the following detailed description and appended claims when taken with the accompanying drawings.

DETAILED DESCRIPTION OF THE PREFERRED EMBODIMENTS

Now, first and second embodiments of the present invention will be described with reference to the drawings.

Figure 1:
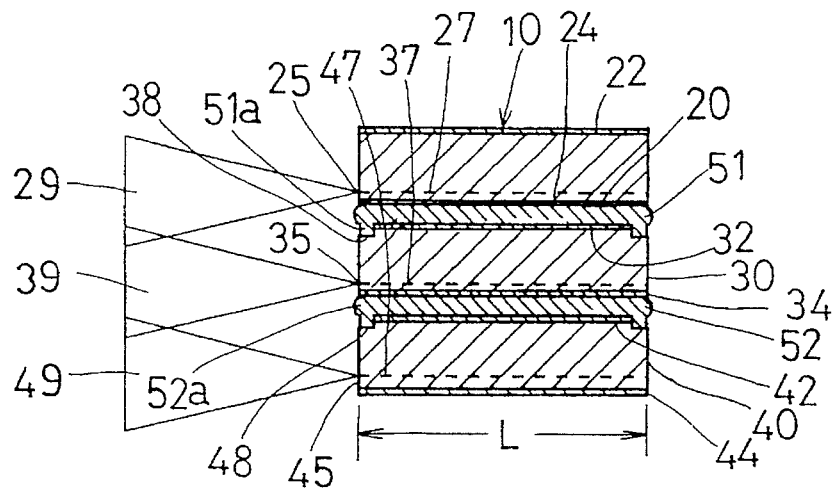
FIG. 1 is a sectional view of a first embodiment of the present invention.
Figure 2:
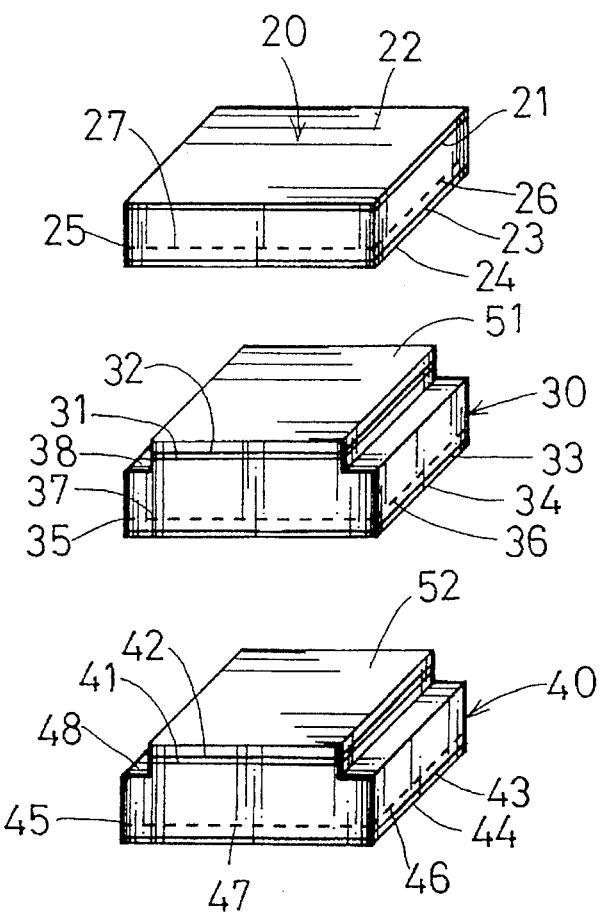
FIG. 2 is a perspective view of separate parts of the first embodiment, showing the same before laminated.

FIG. 1 shows a sectional structure of a semiconductor laser according to the first embodiment of the present invention, and FIG. 2 shows separate parts of the embodiment before laminated. In FIGS. 1 and 2, a semiconductor laser chip stack 10 is composed of semiconductor laser chips 20, 30 and 40 laminated one above another by respective solder layers 51 and 52.

Figure 3:
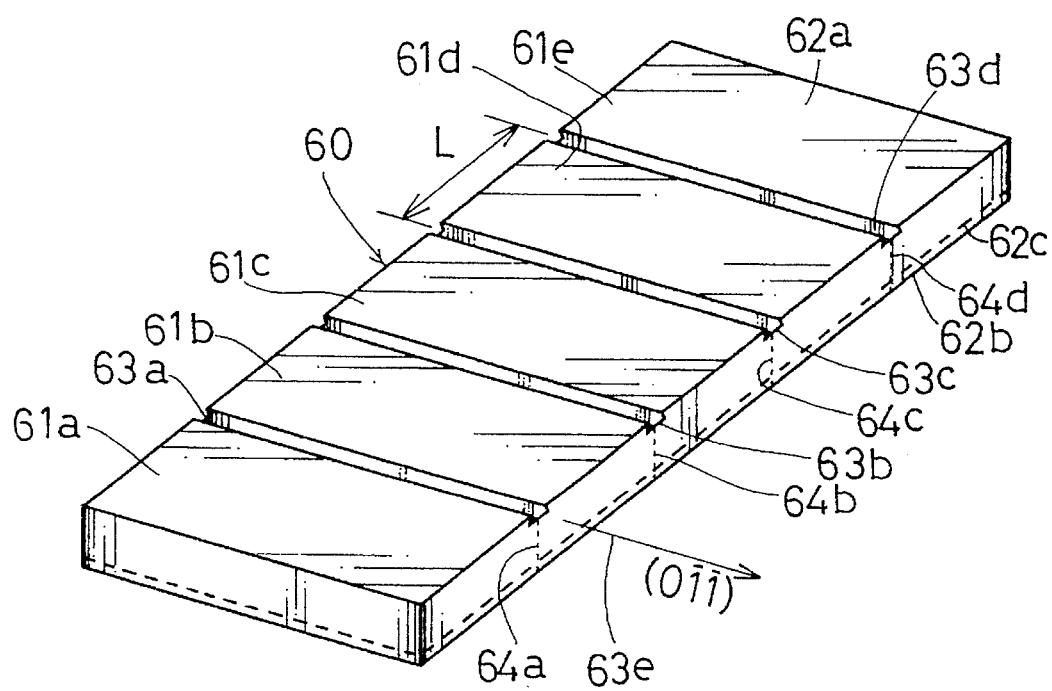
FIG. 3 is a perspective view illustrating a manufacturing method of a second embodiment of the present invention.

The semiconductor laser chip 20 has a substrate surface 21 on the upper surface as seen in the drawing and an epitaxial surface 23 on the lower surface as seen in the drawing, and is 100 μm in thickness. Though both of the substrate surface 21 and the epitaxial surface 23 are substantially square in FIG. 2, they may be of a rectangular configuration as shown in FIG. 3 which will be mentioned later. A first electrode metal layer 22 is provided on the substrate surface 21 and a second electrode metal layer 24 is provided on the epitaxial surface 23, both by resistance heating deposition. The material for the metal layers 22 and 24 is gold (Au) or others.

An active layer 27 which is in the order of 0.1 μm in thickness is formed at a position 3 μm above the epitaxial surface 23 in the drawing. A laser beam radiating surface (partially transparent reflecting surface) 25 is formed at the left end of the active layer 27 as seen in the drawing, and a totally reflecting surface 26 is formed at the right end of the active layer 27 as seen in the drawing. The laser beam radiating surface 25 and the totally reflecting surface 26 cooperate to provide a laser beam resonator. The length of the resonator is 400 μm. A laser beam 29 is emitted from the laser beam radiating surface 25.

Figure 4:
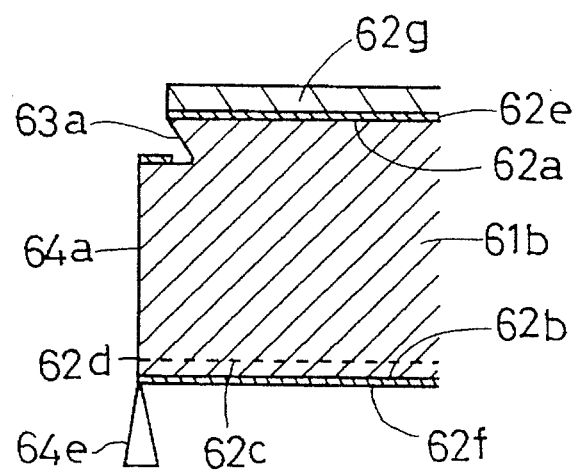
FIG. 4 is a sectional view of a part of the semiconductor laser chip manufactured by the method of FIG. 3.

The semiconductor laser chip 30 has solder sump recesses 38 formed in a substrate surface 31 at opposite ends adjacent to a laser beam radiating surface 35 and a totally reflecting surface 36, respectively, and extending through portions constituting the chip 30 except an active layer 37. Though the recesses 38 are in the form of right-angled notches in FIGS. 1 and 2, they may be in the from of inverted mesa-shaped grooves 63a to 63d having respective bottoms substantially parallel to a surface (substrate surface) 62a of an epitaxial substrate 60, as shown in FIGS. 3 and 4 which will be mentioned later.

The other portions of the semiconductor laser chip 30 are the same as the corresponding portions of the semiconductor laser chip 20. The semiconductor laser chip 30 has a first metal layer 32, an epitaxial surface 33 and a second metal layer 34. Numeral 39 designates a laser beam.

A solder layer 51 is fixedly attached to the surface of the first metal layer 32 by resistance heating deposition. Too large thickness of the solder layer 51 results in increase of connecting resistance and increased amount of solder flashes which will be mentioned later, while too small thickness of the solder layer 51 results in reduction of the connecting strength. The thickness of the solder layer 51 is preferably 7 μm. The solder layer 51 is preferably composed of 75% of Pb and 25% of In in order to obtain good wettability with respect to metal layers such as 32 and to reduce metal erosion.

The structure of the semiconductor laser chip 40 is the same as that of the semiconductor laser chip 30. The semiconductor laser chip 40 has a substrate surface 41, a first metal layer 42, an epitaxial surface 43, a second metal layer 44, a laser beam radiating surface 45, a totally reflecting surface 46, an active layer 47 and recesses 48. Numeral 49 designates a laser beam. A solder layer 52 which is the same as the solder layer 51 in material, manufacturing process and thickness is fixedly attached to the surface of the first metal layer 42.

The semiconductor laser chips 20, 30 and 40 are joined one above another by the solder layers 51 and 52 under heat and pressure in such a manner that the laser beam radiating surfaces 25, 35 and 45 may be coplanar with one another. The adhesion under heat and pressure is performed under a load of about 40 g at a heating temperature of 280° C. for a heating period of 15 seconds. During this process, the solder layers 51 and 52 are extruded, and the solder flashes 51a and 52a formed at the right and left ends thereof as seen in the drawing can be substantially accommodated in the recesses 38 and 48, respectively.

FIG. 3 shows a manufacturing method of a semiconductor laser according to a second embodiment of the present invention. In FIG. 3, an epitaxial substrate 60 for forming semiconductor laser chips comprises a plurality of semiconductor laser chip areas 61a to 61e and is formed on a substrate surface 62a thereof with a plurality of inverted mesa-shaped grooves 63a to 63d spaced at an interval of a resonator length L (40 μm) and having respective bottoms substantially parallel to the substrate surface 62a.

The epitaxial substrate 60 is obtainable by conventional dicing of a wafer prepared for a semiconductor laser by epitaxial growth of various layers on a substrate and has a thickness of 100 μm, but the thickness may be in the range between 80 and 120 μm so as to obtain good mirror surfaces by cleavage as will be mentioned later.

The substrate surface 62a is a (100) surface, and the inverted mesa-shaped grooves 63a to 63d extend in the longitudinal direction as shown by 63e. The inverted mesa-shaped grooves 63a to 63d are formed by wet etching through 10 μm-wide stripe-like slots in a photoresist (not shown), each having an opening width of 20 μm, a maximum width (width at the bottom) of 30 μm and a depth of 20 μm. With such a depth of the groove, the cleaved surface has under the bottom of the groove a thickness of 80 μm, ensuring the thickness of a limit value of 80 μm which permits good cleavage.

Dotted lines in FIG. 3 define ends of cleaved surfaces 64a to 64d. Each of the cleaved surfaces 64a to 64d includes a portion of an active layer 62c which defines a laser beam radiating surface and a totally reflecting surface of the semiconductor laser chip obtainable from the semiconductor laser chip areas 61a to 61e. Cleavage of the epitaxial substrate 60 is started from the epitaxial surface 62b by a cutter edge 64e, as shown in FIG. 4 which will be mentioned later. As the inverted mesa-shaped grooves 63a to 63d each have a flat bottom, the substrate 60 can be cleaved at the position of the cutter edge 64e.

FIG. 4 shows a sectional structure of a portion of the semiconductor laser chip formed in accordance with the manufacturing method shown in FIG. 3. In FIG. 4, after the above mentioned cleavage, a first metal layer 62e, a second metal layer 62f and a solder layer 62g are formed in the same manner as in the first embodiment. Numeral 62d designates a laser beam radiating surface.

Figure 5:
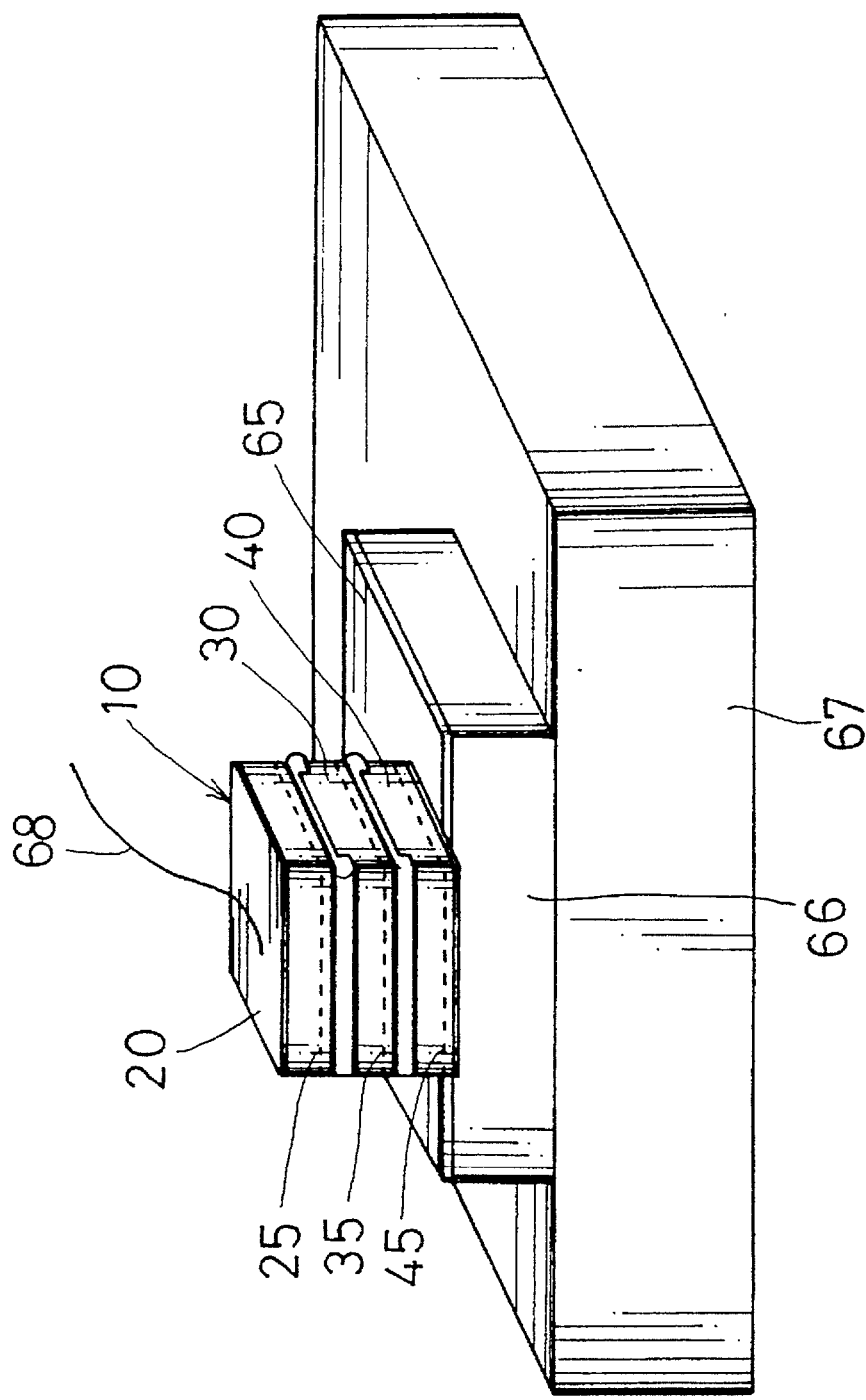
FIG. 5 is a perspective view illustrating a practical structure of the first embodiment.

FIG. 5 shows a practical example of the first embodiment. In FIG. 5, the semiconductor laser chip stack 10 is fixedly attached to the upper surface of a conductive submount 66 by a solder layer 65 as seen in the drawing. The submount 66 is fixedly attached to the upper surface of a conductive heat sink 67 as seen in the drawing. A bonding wire 68 is bonded to the upper surface of the semiconductor laser chip stack 10 as seen in the drawing.

Figure 6:
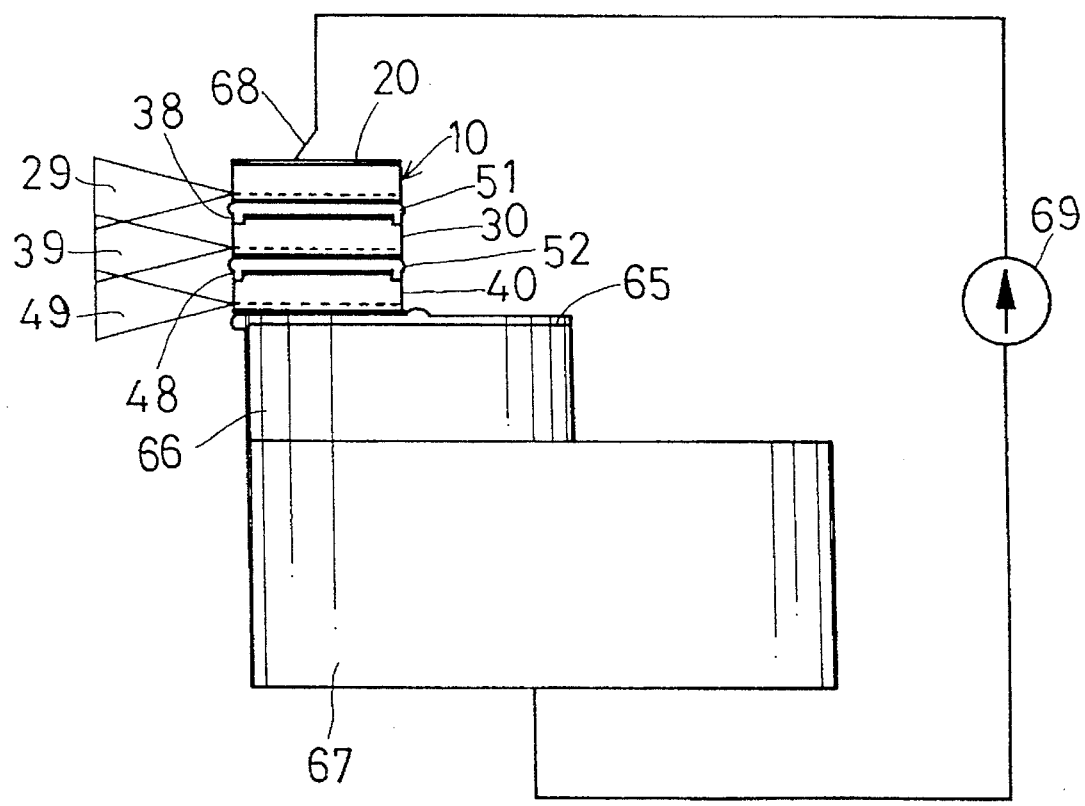
FIG. 6 is a view illustrating the usage of the above practical structure.
Figure 7:
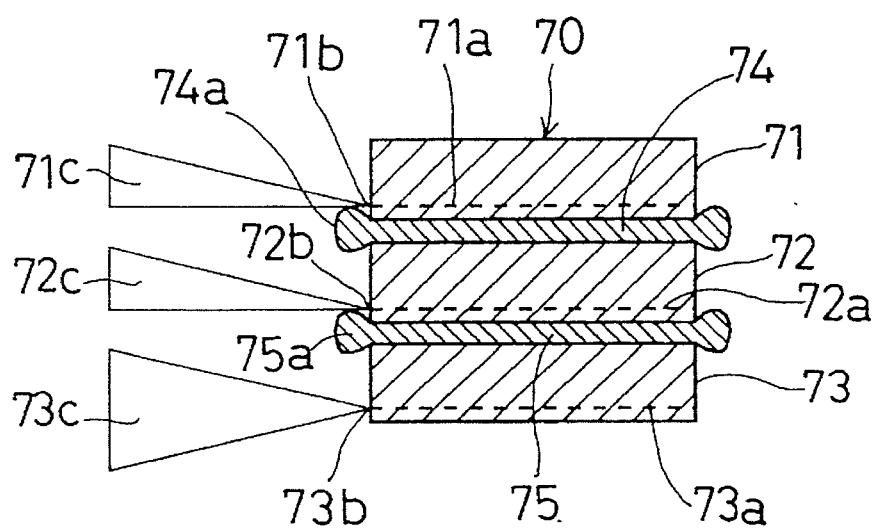
FIG. 7 is a sectional view of a prior art semiconductor laser.

FIG. 6 shows a usage of the practical example. In FIG. 6, the semiconductor laser chip stack 10, the conductive submount 66 and the conductive heat sink 67 are relatively arranged in a different way from that in FIG. 5. Numeral 69 designates a current source for supplying current to the semiconductor laser.

In FIGS. 5 and 6, when current is supplied to the semiconductor laser chip stack 10, the semiconductor laser chips 20, 30 and 40 of the semiconductor laser chip stack 10 emit the laser beams 29, 39 and 49, respectively, as shown in FIGS. 1 and 6. The solder flashes 51a and 52a produced when the semiconductor laser chips 20, 30 and 40 are soldered are substantially accommodated in the solder sump recesses 38 and 48 formed in the substrate surfaces 31 and 41 of the semiconductor laser chips 30 and 40 to be soldered at the ends adjacent to the laser beam radiating surfaces 35 and 45, so that the solder flashes 51a and 52a will cause no interference with the laser beams 29, 39 and 49 emitted from the laser beam radiating surfaces 25, 35, 45 of the semiconductor laser chips 20, 30 and 40.

Furthermore, in this embodiment, the semiconductor laser chips are formed by cleaving the epitaxial substrate 60 along the inverted mesa-shaped grooves 63a to 63d provided on the boundaries of the plurality of semiconductor laser chip areas 61a to 61e for defining reflecting surfaces. Thus, the inverted mesa-shaped grooves 63a to 63d define the solder sump recesses 38 and 48.

In the above embodiments, the solder sump recess adjacent to the totally reflecting surface of the semiconductor laser chip may be omitted.

As described above, in the semiconductor laser and the method of manufacturing the same in accordance with the present invention, substantial reduction of luminous efficiency of radiation caused by the solder layers used for laminating the semiconductor laser chips can be prevented. Thus, the semiconductor laser using the semiconductor laser stack can provide higher output. Further, even in the loading condition in which solder flashes would occur in the prior art, the semiconductor laser of the present invention does not suffer from any disadvantage of such solder flashes, ensuring reliable connecting strength and reduced connecting resistance.

While the invention has been described with reference to preferred embodiments thereof, it is to be understood that modifications or variations may be easily made without departing from the scope of the present invention which is defined by the appended claims.

What is claimed is:

1. A method of manufacturing a semiconductor laser having a plurality of semiconductor laser chips laminated one above another by soldering, comprising the steps of:

providing an epitaxial substrate having a plurality of semiconductor laser chip areas;

forming grooves in a surface of said epitaxial substrate along boundaries of said semiconductor laser chip areas, each of said grooves extending through portions of said substrate except an active layer and having an inverted mesa-shaped configuration;

cleaving said epitaxial substrate along said grooves to provide said semiconductor laser chips with laser beam radiating surfaces defined by the cleaved surfaces; and laminating said plurality of semiconductor laser chip areas one above another by soldering.

2. A semiconductor laser assembly which has an emitting surface and a reflective surface opposite said emitting surface for generating a laser beam therebetween that is emitted from said emitting surface, said assembly comprising:

a plurality of coplanar semiconductor layers wherein each layer includes a substantially coplanar active layer in a portion thereof that produces an associated laser beam between the reflective and emitting surfaces of said assembly, said coplanar layers being formed from segments of a semiconductive layer material that is cleaved along grooves form in said layer thereby to define solder sump recesses along said grooves, a solder layer between respective semiconductor layers for holding together said plurality of semiconductor layers in a unitary structure, each semiconductor layer including said solder sump recess extending along an edge which runs across said semiconductor layer at said emitting surface of said assembly, said solder sump recess partially extending into said semiconductor layer to a depth that avoids disturbing said active layer and wherein said solder sump recess has an inverted mesa-shaped configuration, whereby, during assembly, said solder is directed into said solder sump recess rather than forming a solder flash which interferes with the emission path of said laser beam at said emitting surface of said assembly.

\* \* \* \* \*